United States Patent
Song et al.

(10) Patent No.: US 9,786,784 B1
(45) Date of Patent: Oct. 10, 2017

(54) VERTICAL FIELD EFFECT TRANSISTOR AND METHOD OF FABRICATING THE SAME

(71) Applicant: SAMSUNG ELECTRONICS CO., LTD., Suwon-Si, Gyeonggi-Do (KR)

(72) Inventors: Hyun Seung Song, Hwaseong-Si (KR); Soo Yeon Jeong, Osan-Si (KR); Hyung Suk Lee, Suwon-Si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/271,660

(22) Filed: Sep. 21, 2016

Related U.S. Application Data

(60) Provisional application No. 62/342,351, filed on May 27, 2016.

(51) Int. Cl.
*H01L 29/78* (2006.01)
*H01L 29/423* (2006.01)
*H01L 29/417* (2006.01)
*H01L 21/306* (2006.01)
*H01L 29/66* (2006.01)

(52) U.S. Cl.
CPC ...... *H01L 29/785* (2013.01); *H01L 21/30604* (2013.01); *H01L 29/41791* (2013.01); *H01L 29/4236* (2013.01); *H01L 29/6656* (2013.01); *H01L 29/66666* (2013.01); *H01L 29/66795* (2013.01); *H01L 29/7827* (2013.01)

(58) Field of Classification Search
CPC ............... H01L 29/785; H01L 29/7827; H01L 29/4236; H01L 29/66666; H01L 21/30604; H01L 29/66795; H01L 29/6656; H01L 29/41791
See application file for complete search history.

(56) References Cited

U.S. PATENT DOCUMENTS

| | | | |
|---|---|---|---|
| 4,343,015 A | 8/1982 | Baliga et al. | |
| 5,989,961 A | 11/1999 | Yang et al. | |
| 6,897,098 B2 | 5/2005 | Hareland et al. | |
| 7,446,025 B2 | 11/2008 | Cohen et al. | |
| 8,685,788 B2 | 4/2014 | Bao et al. | |
| 8,940,605 B2 | 1/2015 | Disney | |
| 8,969,963 B2 * | 3/2015 | Basker | H01L 29/66795 257/347 |
| 2015/0348977 A1 | 12/2015 | Barth, Jr. et al. | |

* cited by examiner

*Primary Examiner* — David Vu
(74) *Attorney, Agent, or Firm* — F. Chau & Associates, LLC

(57) ABSTRACT

A vertical fin field effect transistor (V-FinFET) is provided as follows. A T-shaped fin structure extend vertically from an upper surface of a substrate. The T-shaped fin structure includes a lower part and an upper part. The lower part is in contact with the upper surface of the substrate. The upper part of the T-shaped fin structure is vertically stacked on the lower part of the T-shaped fin structure. A gate insulating layer surrounds the lower part. A work-function-control pattern surrounds the lower part. The gate insulating layer is interposed between the work-function-control pattern and the lower part of the T-shaped fin structure. A gate electrode is disposed on a sidewall of the work-function-control pattern.

14 Claims, 21 Drawing Sheets

VERTICAL FIELD EFFECT TRANSISTOR AND METHOD OF FABRICATING THE SAME

CROSS-REFERENCE TO RELATED APPLICATION

This application claims the benefit under 35 U.S.C. §119 (e) to United States Provisional Patent Application No. 62/342,351, filed on May 27, 2016 in the United States Patent & Trademark Office, the disclosure of which is incorporated by reference herein in its entirety.

TECHNICAL FIELD

The present inventive concept relates to a vertical fin field effect transistor and a method of fabricating the same.

DISCUSSION OF RELATED ART

Transistors have been planar. As the transistors shrink, leakage current increases, draining batteries and heating up semiconductor chips. To reduce the leakage current, various transistor structures have been proposed.

SUMMARY

According to an exemplary embodiment of the present inventive concept, a vertical fin field effect transistor (V-FinFET) is provided as follows. A T-shaped fin structure extend vertically from an upper surface of a substrate. The T-shaped fin structure includes a lower part and an upper part. The lower part is in contact with the upper surface of the substrate. The upper part of the T-shaped fin structure is vertically stacked on the lower part of the T-shaped fin structure. A gate insulating layer surrounds the lower part. A work-function-control pattern surrounds the lower part. The gate insulating layer is interposed between the work-function-control pattern and the lower part of the T-shaped fin structure. A gate electrode is disposed on a sidewall of the work-function-control pattern.

According to an exemplary embodiment of the present inventive concept, a vertical fin field effect transistor (V-FinFET) is provided as follows. A first T-shaped fin structure and a second T-shaped fin structure extend vertically from an upper surface of the substrate. Each of the first and second T-shaped fin structures includes a lower part and an upper part. Each of the lower parts of the first and second T-shaped fin structures is in contact with the upper surface of the substrate. Each of the upper parts of the first and second T-shaped fin structures is stacked on each of the lower parts of the first and second T-shaped fin structures. A recessed trench is disposed between the first T-shaped fin structure and the second T-shaped fin structure. A gate insulating layer is disposed within the recessed trench. First and second work-function-control patterns are disposed within the recessed trench so that a sidewall of the first work-function-control pattern is beyond a sidewall of the upper part of the first T-shaped fin structure and a sidewall of the second work-function-control pattern is beyond a sidewall of the upper part of the second T-shaped fin structure. A gate electrode is disposed between the first work-function-control pattern and the second work-function-control pattern.

According to an exemplary embodiment of the present inventive concept, a method of fabricating a vertical fin field effect transistor (V-FinFET) is provided as follows. At least one etching process is performed to form a first T-shaped fin structure, a second T-shaped fin structure and a recessed trench therebetween. Each of the first and second T-shaped fin structures includes a lower part and an upper part. Each of the lower parts of the first and second T-shaped fin structures is in contact with an upper surface of a substrate. The upper parts of the first and second T-shaped fin structures are stacked on the lower parts of the first and second T-shaped fin structures so that each of the upper parts of the first and second T-shaped fin structures has an overhang part which is non-overlapped with each of the lower parts of the first and second T-shaped fin structures. A gate insulating layer is conformally formed within the recessed trench. A preliminary work-function-control layer is formed on the gate insulating layer to fill the recessed trench. An anisotropic etching process is performed on the preliminary work-function-control layer using the overhang part of the first T-shaped fin structure and the overhang part of the second T-shaped fin structure as an etch mask to form a first work-function-control pattern and a second work-function-control pattern. A sidewall of the first work-function-control pattern is positioned beyond a sidewall of the upper part of the first T-shaped fin structure. A gate electrode is formed to be interposed between the first work-function-control pattern and the second work-function-control pattern.

BRIEF DESCRIPTION OF DRAWINGS

These and other features of the present inventive concept will become more apparent by describing in detail exemplary embodiments thereof with reference to the accompanying drawings of which:

FIGS. 5A to 7A show cross-sectional views of the V-FinFET of FIG. 1A formed according to the flowchart of FIG. 2;

Figure 1:
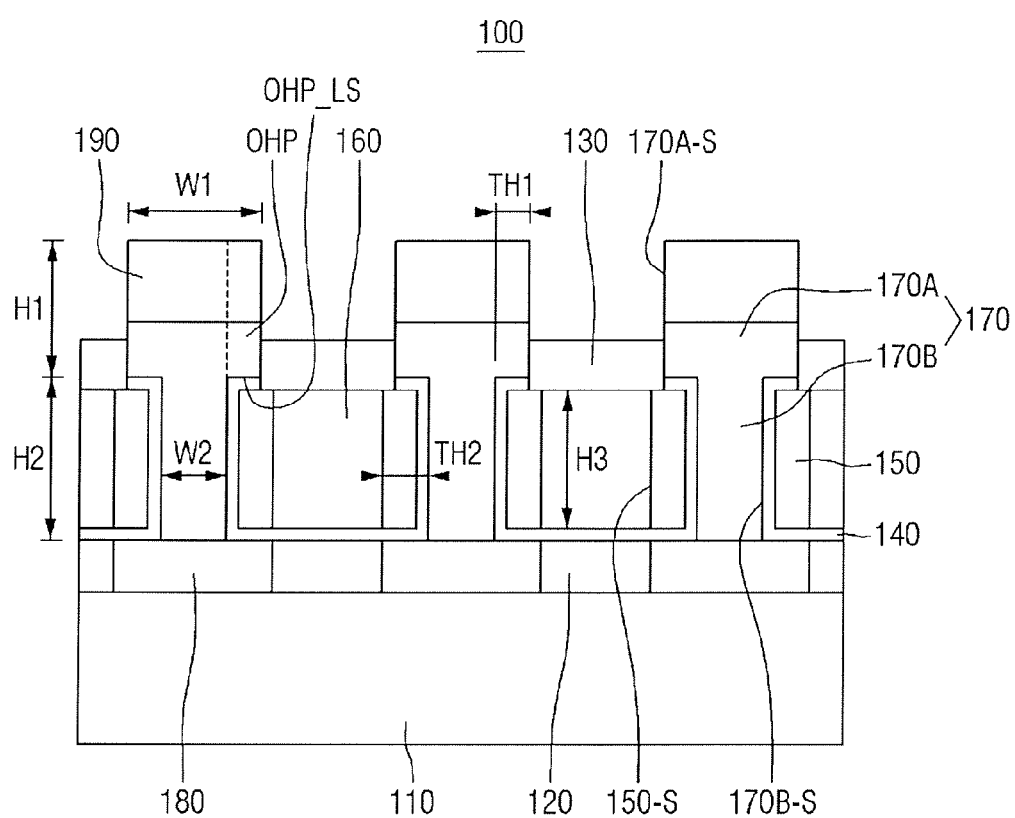
FIG. 1 shows a cross-sectional view of a vertical fin field effect transistor (V-FinFET) according to an exemplary embodiment of the present inventive concept.

It will be appreciated that for simplicity and clarity of illustration, elements illustrated in the drawings have not necessarily been drawn to scale. For example, the dimensions of some of the elements are exaggerated relative to other elements for clarity. Further, where considered appropriate, reference numerals have been repeated among the drawings to indicate corresponding or analogous elements.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

DETAILED DESCRIPTION OF EXEMPLARY EMBODIMENTS

Exemplary embodiments of the present inventive concept will be described below in detail with reference to the accompanying drawings. However, the inventive concept may be embodied in different forms and should not be construed as limited to the embodiments set forth herein. It will also be understood that when an element is referred to as being "on" another element or substrate, it may be directly on the other element or substrate, or intervening layers may also be present. It will also be understood that when an element is referred to as being "coupled to" or "connected to" another element, it may be directly coupled to or connected to the other element, or intervening elements may also be present.

FIG. 1 shows a cross-sectional view of a vertical fin field effect transistor (V-FinFET) 100 according to an exemplary embodiment of the present inventive concept. The V-FinFET 100 may be an N-type transistor or a P-type transistor.

The V-FinFET 100 includes a T-shaped fin structure 170. The T-shaped fin structure 170 is disposed on an upper surface of a substrate 110. For example, the T-shaped fin structure 170 is vertically extended from the upper surface of the substrate 110.

The T-shaped fin structure 170 includes an upper part 170A and a lower part 170B. The upper and lower parts 170A and 170B of the T-shaped fin structure 170 have different widths. For example, the upper part 170A has a first width W1 and the lower part 170B has a second width W2 smaller than the first width W1. Accordingly, the upper part 170A has an overhang part OHP due to the width difference. The overhang part OHP has a first thickness TH1 which is substantially equal to the difference between the first width W1 and the second width W2.

The upper and lower parts 170A and 170B of the T-shaped fin structure 170 have different heights. For example, the upper part 170A has a first height H1 and the lower part 170B has a second height H2 greater than the first height H1. The first height H1 of the upper part 170A is such that an upper source/drain 190 is formed within the upper part 170A. The present inventive concept is not limited thereto. For example, the first and second heights H1 and H2 may be substantially the same or the second height H2 is greater than the first height H1.

The V-FinFET 100 may have a channel in the lower part 170A of the T-shaped fin structure 170. For example, when the V-FinFET 100 turns on, the channel may formed along a sidewall 170B-S of the lower part 170B and a transistor turn-on current may flows along the channel.

The V-FinFET 100 includes a gate insulating layer 140 and a work-function-control pattern 150. The gate insulating layer 140 and the work-function-control pattern 150 are disposed under the overhang part OHP of the T-shaped fin structure 170 so that a sidewall 150-S of the work-function-control pattern 150 extends toward a gate electrode 160 beyond a sidewall 170A-S of the upper part 170A. For example, the sidewall 150-S of the work-function-control pattern 150 is positioned beyond the sidewall 170A-S of the upper part 170A.

The gate insulating layer 140 is disposed on a lower surface OHP-LS of the overhang part OHP of the T-shaped fin structure 170 and a sidewall 170B-S of the lower part 170B of the T-shaped fin structure 170. The gate insulating layer 140 is also disposed on the upper surface of the substrate 110 and an upper surface of a lower spacer 120.

The gate insulating layer 140 may be formed of a high-k dielectric material including $HfO_2$ or $HfSiO_x$, where x is a rational number less than 1. The gate insulating layer 140 may be formed using various deposition processes including a chemical vapor deposition (CVD) process, a plasma enhanced CVD (PECVD) process, a metallorganic CVD (MOCVD) process or an atomic layer deposition process (ALD) process.

The work-function-control pattern 150 is disposed on the gate insulating layer 140. In this case, the gate insulating layer 140 is interposed between the work-function-control pattern 150 and the sidewall 170B-S of the lower part 170B of the T-shaped fin structure 170; the gate insulating layer 140 is also interposed between the lower surface OHP-LS of the overhang part OHP and an upper surface of the work-function-control layer 150. The gate length of the V-FinFET 100 is determined by the height H2 of the work-function-control pattern 150. Since the work-function-control pattern 150 fills a region underneath of the overhang part OHP, the formation of the T-shaped fin structure may determine the gate length of the V-FinFET 100, irrespective of the size of a gate electrode 160 of the V-FinFET 100.

The combination structure of the gate insulating layer 140 and the work-function-control pattern 150 fills a region underneath the overhang part OHP of the T-shaped fin structure 170.

The work-function-control pattern 150 may be formed of nitride including TiN. The present inventive concept is not limited thereto. The work-function-control pattern 150 may be formed of various materials depending on whether the V-FinFET 100 is formed as an N-type transistor or a P-type transistor. The work-function-control pattern 150 may be formed in at least two different material layers.

The V-FinFET 100 includes a gate electrode 160 disposed between two adjacent T-shaped fin structures 170. When viewed from the above of the V-FinFET 100, the gate electrode 160 may surround the T-shaped fin structures 170. The gate electrode 160 has an upper surface which is coplanar with an interface between the upper part 170A and the lower part 170B. For example, the gate electrode 160 and the work-function-control pattern 150 have substantially the same heights. The present inventive concept is not limited thereto. For example, the height H3 of the gate electrode 160 is smaller or greater than a height of the work-function-control pattern 150.

Since the gate length of the V-FinFET 100 is determined by the height H2 of the work-function-control layer 150, the gate electrode 160, if having a variation in a height H3 of the gate electrode 160, does not affect the gate length of the V-FinFET 100.

The V-FinFET 100 includes a lower spacer 120 and an upper spacer 130 to prevent electrical shortage between the gate electrode 150 and a lower source/drain (S/D) 180 and between the gate electrode 150 and an upper S/D 190, respectively.

Figure 1A:
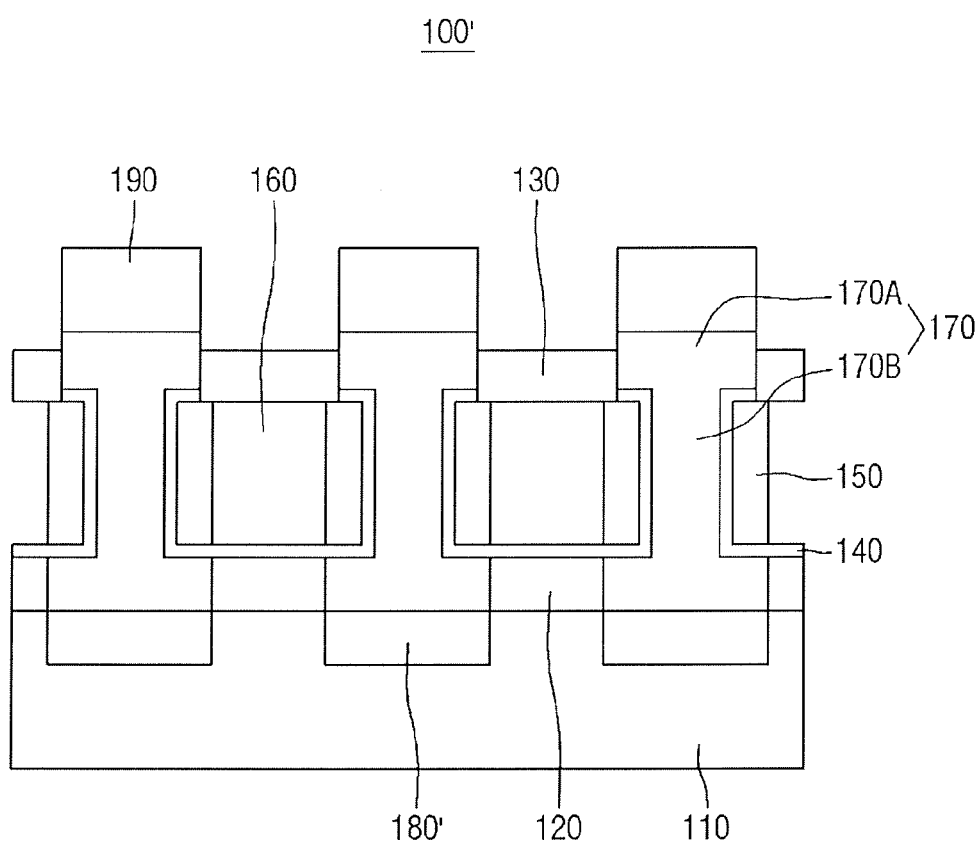
FIG. 1A shows a cross-sectional view of a vertical fin field effect transistor (V-FinFET) according to an exemplary embodiment of the present inventive concept.

The lower S/D 180 is disposed in the substrate 110. For example, the lower S/D 180 may be disposed between two adjacent lower spacers 120. The present inventive concept is not limited thereto. For example, FIG. 1A shows a V-FinFET 100' having a lower S/D 180' disposed below the lower spacer 120. The other elements of the V-FinFET 100' are substantially the same as those of the V-FinFET 100 of FIG. 1, and thus the descriptions of the same elements are omitted herein.

The upper S/D 190 is disposed in the upper part 170A of the T-shaped fin structure 170. In an exemplary embodiment, the upper S/D 190 may be epitaxially grown from the upper part 170A.

With the T-shaped fin structure 170, a gate length of the V-FinFET is controlled by controlling the second height H2 of the lower part of the T-shaped fin structure 170.

Hereinafter, a method of fabricating the V-FinFET 100 will be described with reference to FIGS. 2 to 14.

Figure 2:
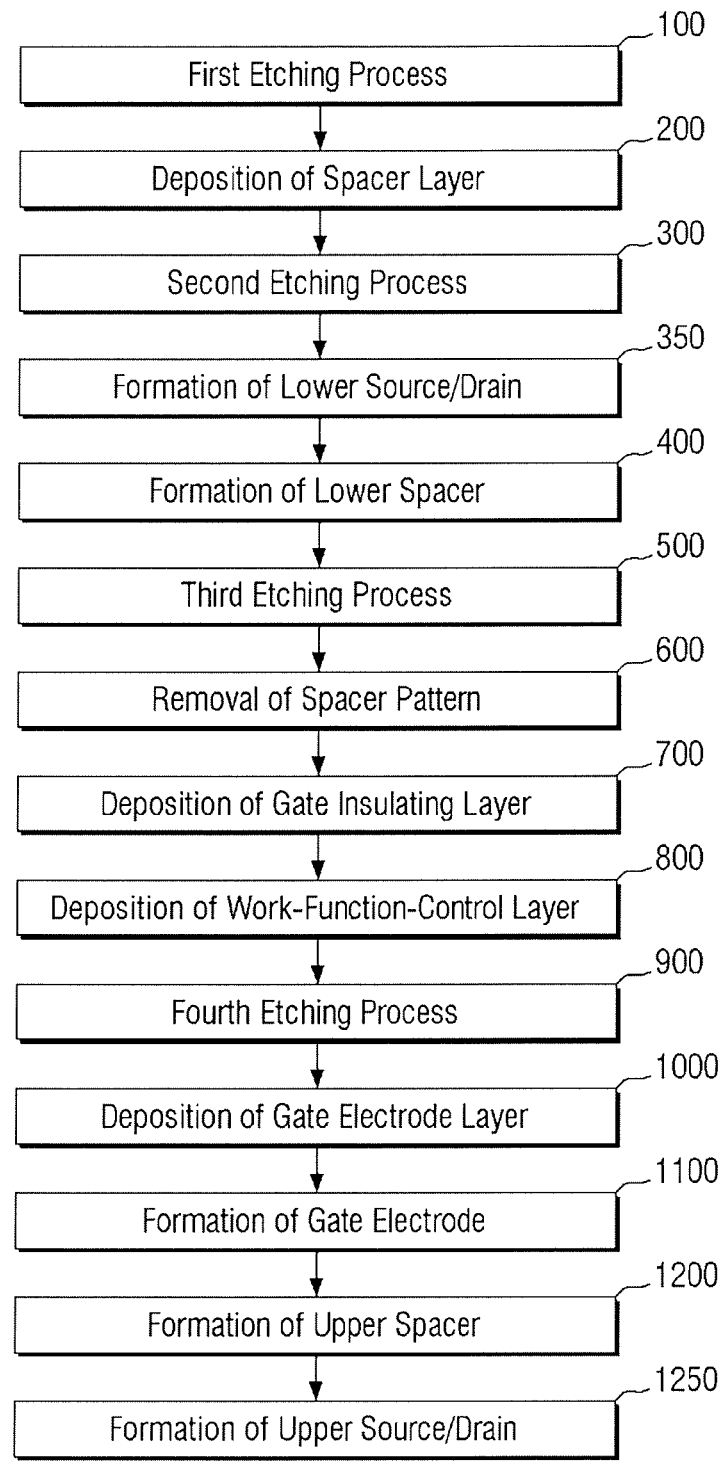
FIG. 2 shows a flowchart of fabricating the V-FinFET of FIG. 1 according to an exemplary embodiment of the present inventive concept.

FIG. 2 is a flowchart of fabricating the V-FinFET 100 of FIG. 1 according to an exemplary embodiment of the present inventive concept. FIGS. 3 to 14 show cross-sectional views of the V-FinFET 100 formed according to the flowchart of FIG. 2.

The flowchart of FIG. 2 may be applied to fabricate the V-FinFET 100' of FIG. 1A. FIGS. 5A to 7A show cross-sectional views of the V-FinFET 100' formed according to the flowchart of FIG. 2.

Figure 3:
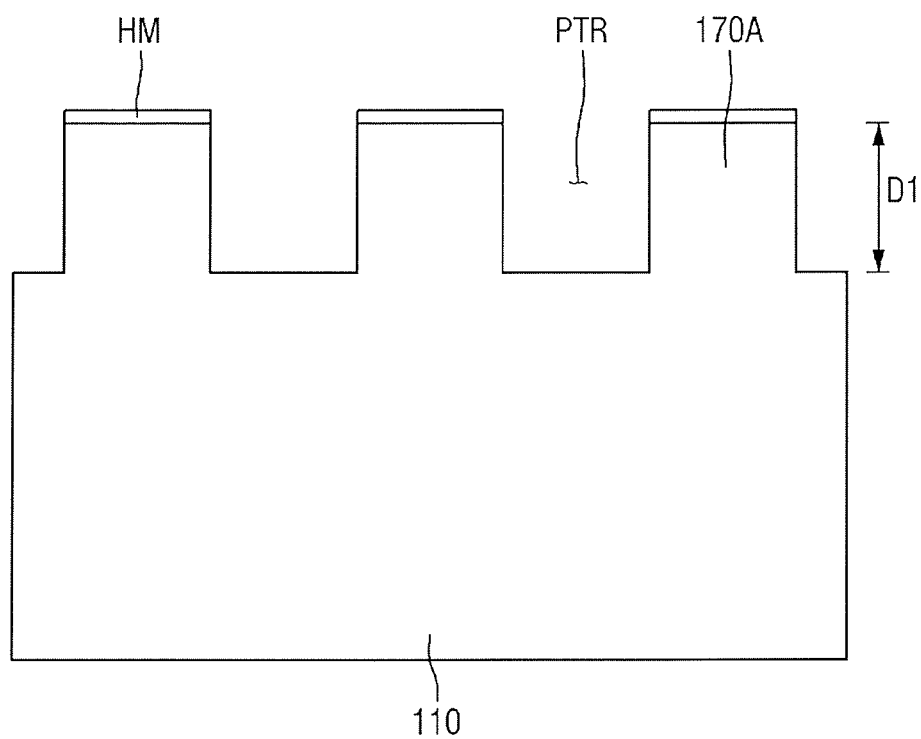
FIGS. 3 to 14 show cross-sectional views of the V-FinFET of FIG. 1 formed according to the flowchart of FIG. 2.

FIG. 3 shows a pattern 170A and a preliminary trench PTR formed after step 100 of FIG. 2 is performed according to an exemplary embodiment of the present inventive concept.

In step 100, a first etching process may be performed on a substrate 110 to form the pattern 170A using a hard mask HM. The hard mask HM may formed of TiN, for example. The first etching process may be a directional etching process including a reactive ion etching (RIE) process. In this case, an upper surface of the substrate which is not covered by the hard mask HM is partially recessed so that the preliminary trench PTR is formed to have a first depth D1 in the substrate 110. The preliminary trench PTR is formed between two adjacent patterns 170A. For example, the pattern 170A is defined by the preliminary trench PTR. When viewed from the above, the preliminary trench PTR may surround the patterns 170A.

The substrate 110 may be formed of silicon (Si) or an alloy of silicon and germanium (SiGe). In this case, the first etching process may use a gas including $CF_4$, Cl or Br to have etch selectivity of the substrate 110 with respect to the hard mask HM. The present invention is not limited thereto. Various etchant gases may be used in the first etching process.

The pattern 170A will remain as the upper part 170A of FIG. 1 after the V-FinFET 100 is formed according to an exemplary embodiment of the present inventive concept. Accordingly, the pattern 170A may be also referred to as the upper part 170A. An upper source/drain of the V-FinFET 100 may be formed with the upper part 170A. The formation of the upper source/drain will be described later with reference to FIG. FIG. 14.

Figure 4:
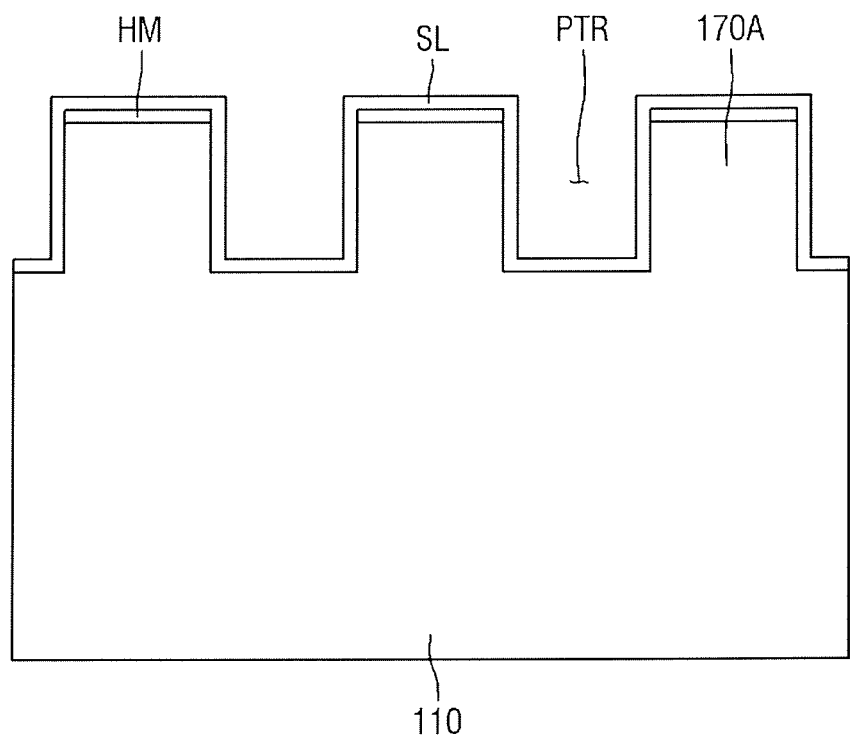

FIG. 4 shows a spacer layer SL formed after step 200 of FIG. 2 is performed according to an exemplary embodiment of the present inventive concept.

In step 200, the spacer layer SL may be conformally formed on the resulting structure of FIG. 3 using a CVD process, a PECVD process or an ALD process. For example, the spacer layer SL is formed on the pattern 170A and an upper surface of the recessed substrate 110 without completely filling the preliminary trench PTR. The spacer layer SL may be formed of silicon nitride (SiN) or silicon oxide ($SiO_2$).

The hard mask HM is interposed between the spacer layer SL and the pattern 170A.

Figure 5:
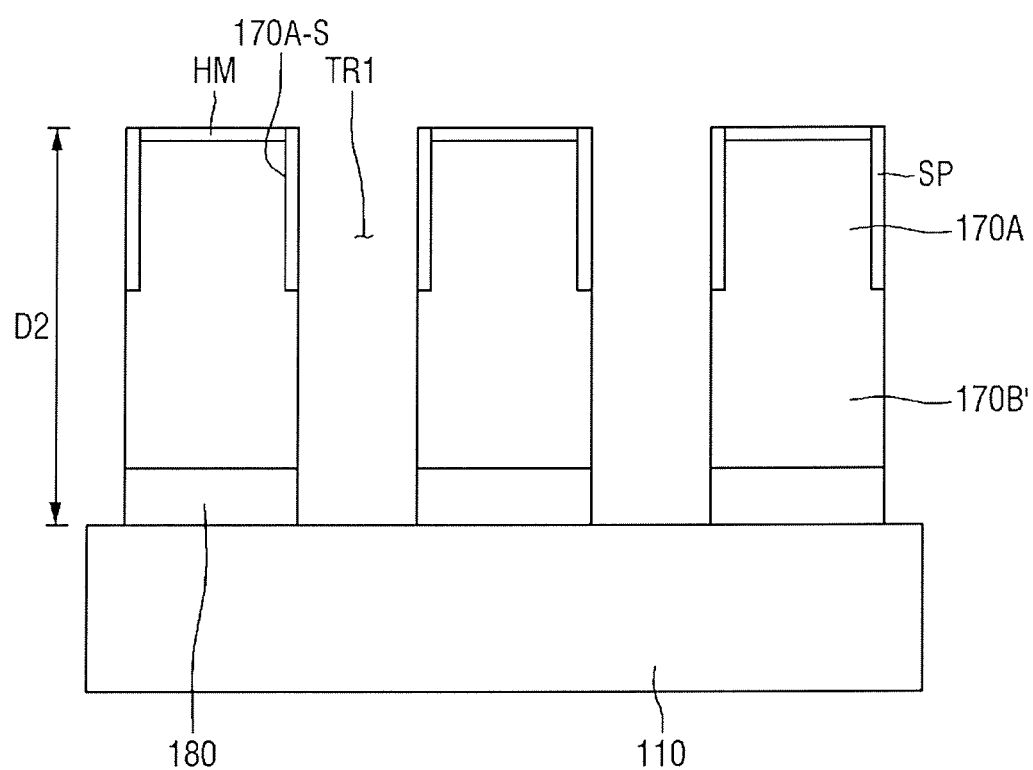

FIG. 5 shows a first trench formed after step 300 of FIG. 2 is performed according to an exemplary embodiment of the present inventive concept.

In step 300, a second etching process may be performed on the substrate 110 to form a first trench TR1 using the hard mask HM as an etch mask. The second etching process may be a directional etching process including an RIE process. In the second etching process, upper and lower parts of the spacer layer SL are removed and the preliminary trench PTR of FIG. 4 is further recessed to form the first trench TR1 having a second depth D2 greater than the first depth D1. In this case, a sidewall part of the spacer layer SL remains unetched to cover the sidewall 170A-S of the upper part 170A. The remaining sidewall of the spacer layer SL is referred to as a spacer pattern SP.

The hard mask HM and the spacer pattern SP may serve as an etch mask to form the first trench TR1. While the preliminary trench PTR is recessed in the second etching process, the spacer pattern SP protects the sidewall 170A-S of the upper part and defines a preliminary lower part 170B' of a T-shaped fin structure 170 of FIG. 1. For example, the first trench TR1 is disposed between two adjacent spacer patterns SP; and the first trench TR1 is also disposed between two adjacent preliminary lower parts 170B'.

Due to the directionality of the second etching process, a sidewall part of the spacer layer SL remains as the spacer pattern SP after the second etching process is performed.

Figure 5A:
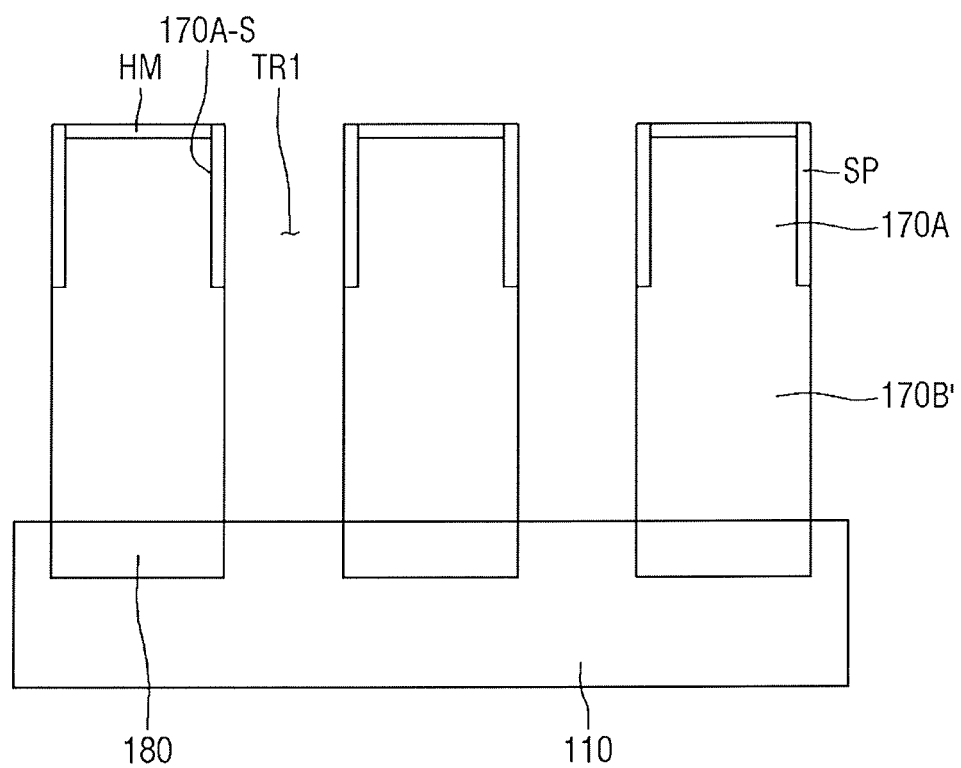

After the formation of the first trench TR1, step 350 of FIG. 2 is performed to form a lower source/drain (S/D) 180 using an ion implantation process. P-type impurities including $B^+$ or N-type impurities including $As^+$ may be doped in the lower S/D using the ion implantation process. The location of the lower S/D 180 may be determined by controlling as-implant depth profile of the impurities. For example, the lower S/D 180 is formed in the preliminary lower part 170B' exposed through the first trench TR1. The present inventive concept is not limited thereto. For example, FIG. 5A shows that a lower S/D 180' is formed below a bottom surface of the preliminary lower part 170B'.

The flowchart of fabricating the V-FinFET 100 of FIG. 2 shows that the formation of the lower S/D (step 350) is preceded by the second etching process (Step 300). The present invention is not limited thereto. For example, the formation of the lower S/D (step 350) is performed before the second etching process (300) is performed.

Figure 6:
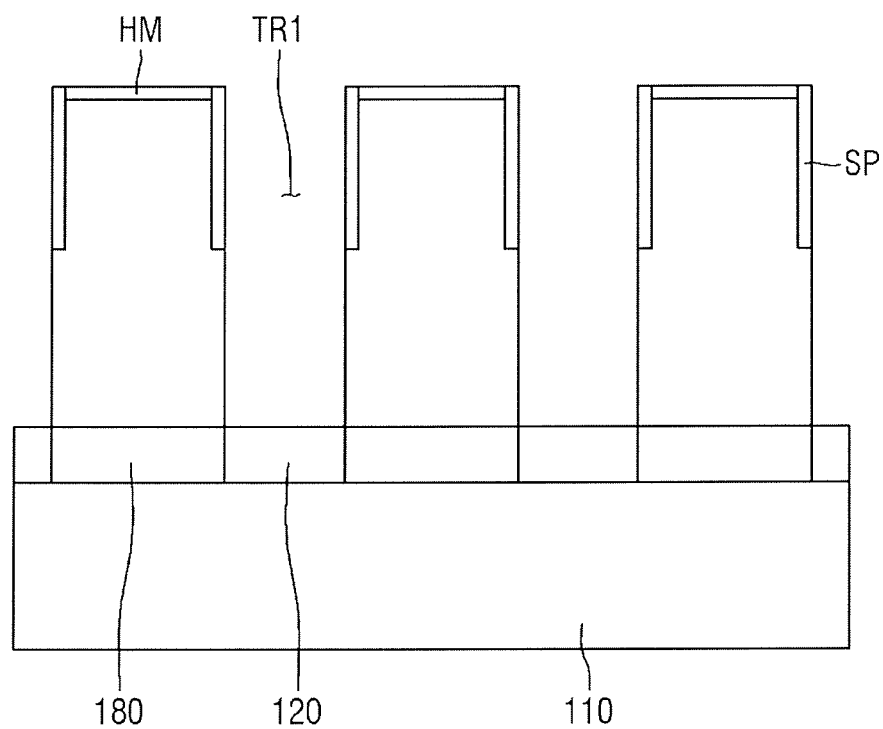
Figure 6A:
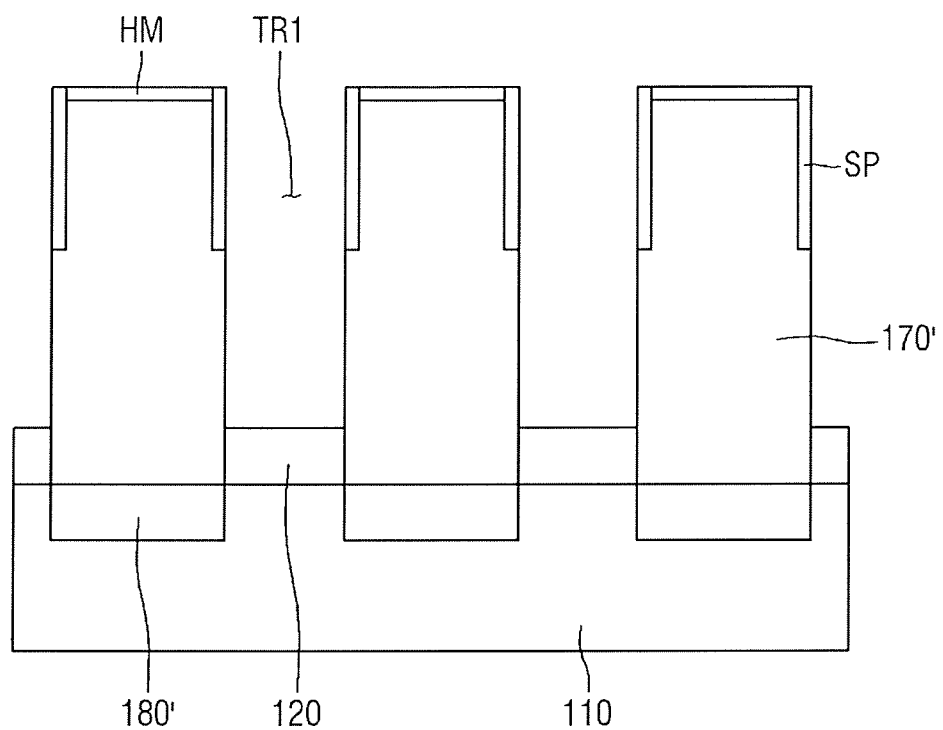

FIG. 6 shows a lower spacer 120 formed after step 400 of FIG. 2 is performed according to an exemplary embodiment of the present inventive concept. The lower S/D 180 is disposed between two adjacent lower spacers 120. The present inventive concept is not limited thereto. For example, FIG. 6A shows that the lower S/D 180' is formed below the lower surface of the preliminary lower part 170'.

The lower spacer 120 is formed within the trench. The formation of the lower spacer 120 is described in U.S. patent application Ser. No. 15/229,881, filed on Aug. 5, 2016, which is hereby incorporated by reference.

Figure 7:
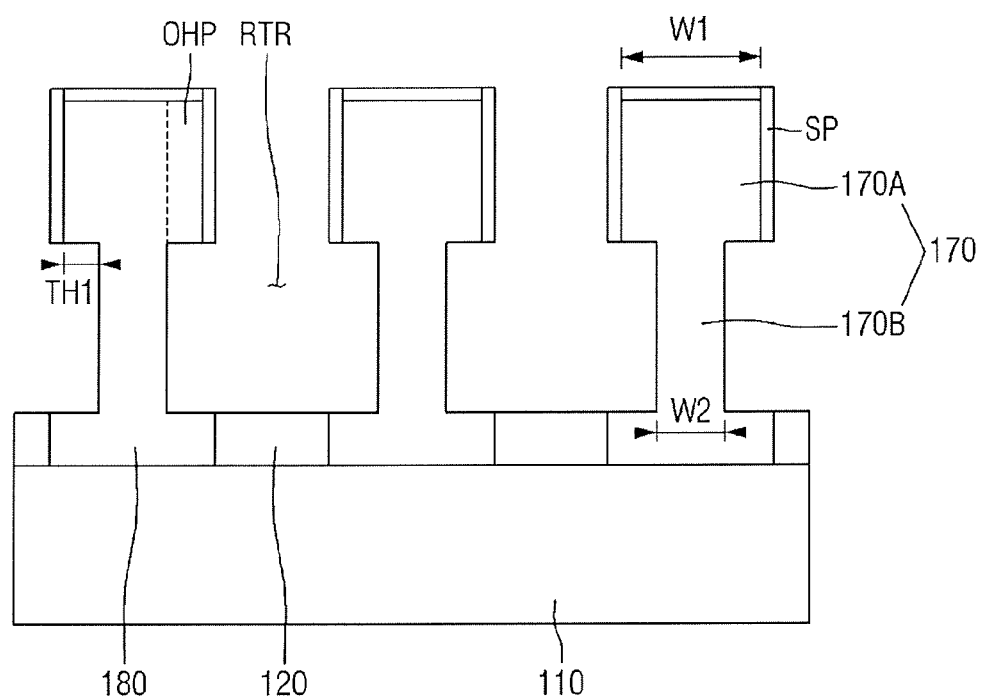

FIG. 7 shows a recessed trench RTR of the trench in step 500 of FIG. 2 is performed according to an exemplary embodiment of the present inventive concept.

The first trench TR1 is laterally recessed using a third etching process to form a recessed trench RTR. The third etching process may be an isotropic etching process including a wet etching process or a dry etching process. For example, the preliminary lower part 170B' is laterally recessed to form the lower part 170B. In the third etching process, the upper part 170A is covered by the spacer patter SP and the hard mask HM so that the upper part 170A is protected from etchants of the third etching process.

Because the preliminary lower part 170B' is laterally recessed and the upper part 170A is protected from the etchants, the T-shaped fin structure 170 having an overhang part OHP is formed. The thickness TH1 of the overhang part OHP is determined by the amount of the lateral recess of the preliminary lower part 170B'. The thickness TH1 may be also referred to as an overhang part thickness TH1.

The third etching process may include an isotropic etching process using $CF_4$, Cl or Br gases as etchants. The isotropic etching process may be performed by a wet etching process or a dry etching process.

Figure 7A:
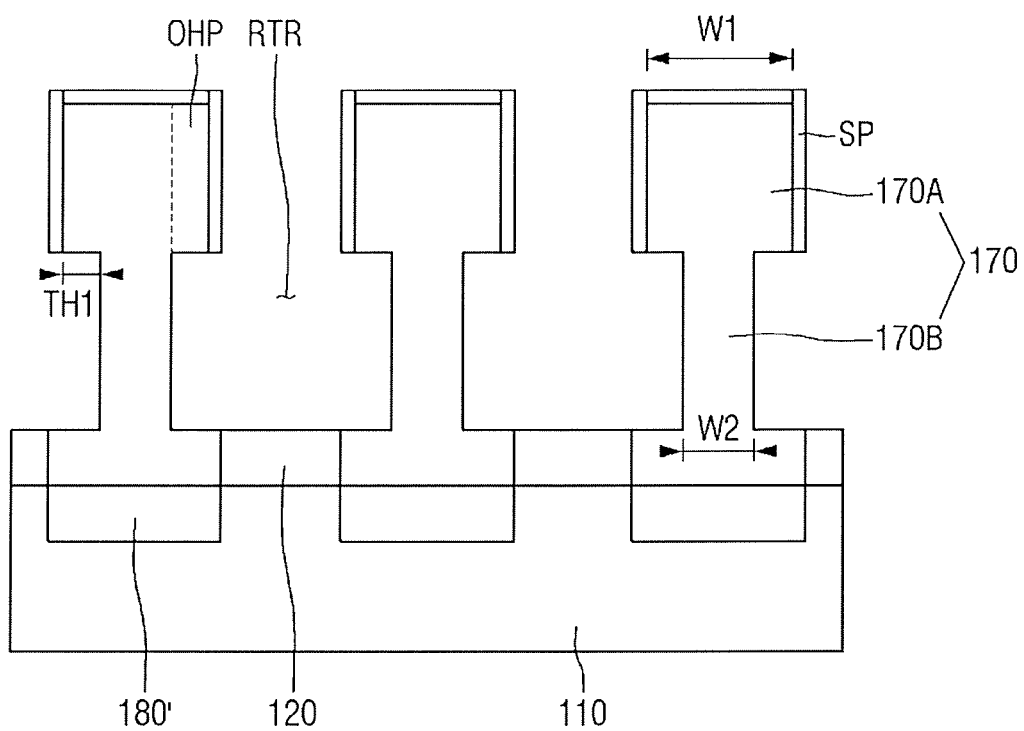

The recessed trench RTR exposes the lower S/D 180 disposed between two adjacent lower spacers 120. The present inventive concept is not limited thereto. For example, FIG. 7A shows that after performing of step 500, the recessed trench RTR does not expose the lower S/D 180' because the lower S/D 180' is formed below the lower spacer 120.

With the first, second and third etching process, the T-shaped structure 170 is formed to have the upper part 170A and the lower part 170B. The upper part 170A has an width W1 and the lower part 170B has an width W2 smaller than the width W1. The width difference of W1 and W2 may be substantially equal to the overhang part thickness TH1.

For the convenience of description, an upper surface of the substrate 110 is shown to have a flat surface. However, the upper surface of the substrate 110 may be recessed. The recessed' surface may be filled by a preliminary gate insulating layer 140P which will be described with reference to FIG. 9.

Figure 8:
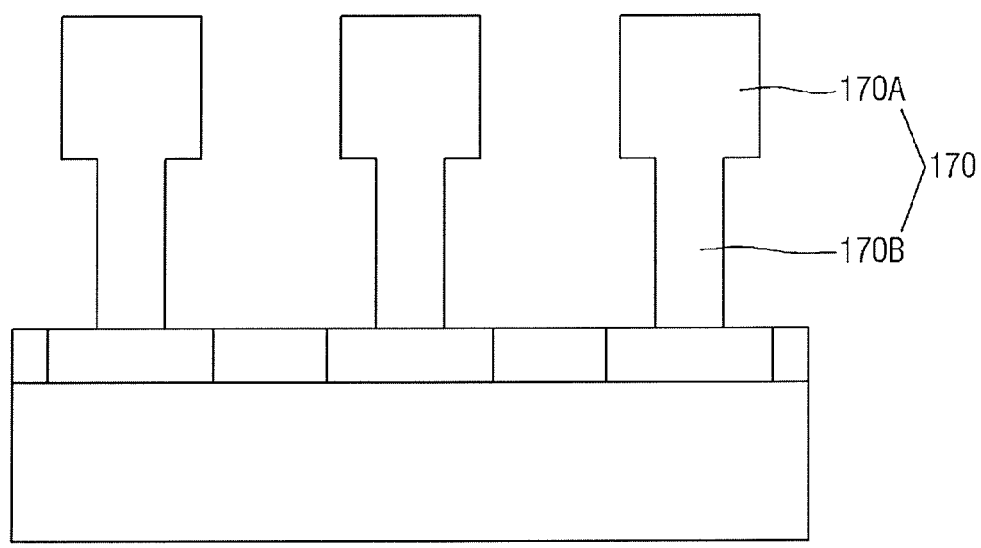

FIG. 8 shows removal of the spacer pattern in step 600 of FIG. 2 according to an exemplary embodiment of the present inventive concept.

The spacer pattern SP and the hard mask HM are removed from the upper part 170A of the T-shaped fin structure 170. For example, an isotropic etching process may be used to remove the spacer pattern SP. The spacer pattern SP and the hard mask HM may be removed using the same process. In an exemplary embodiment, the spacer pattern SP and the hard mask HM may be separately removed using different processes.

Figure 9:
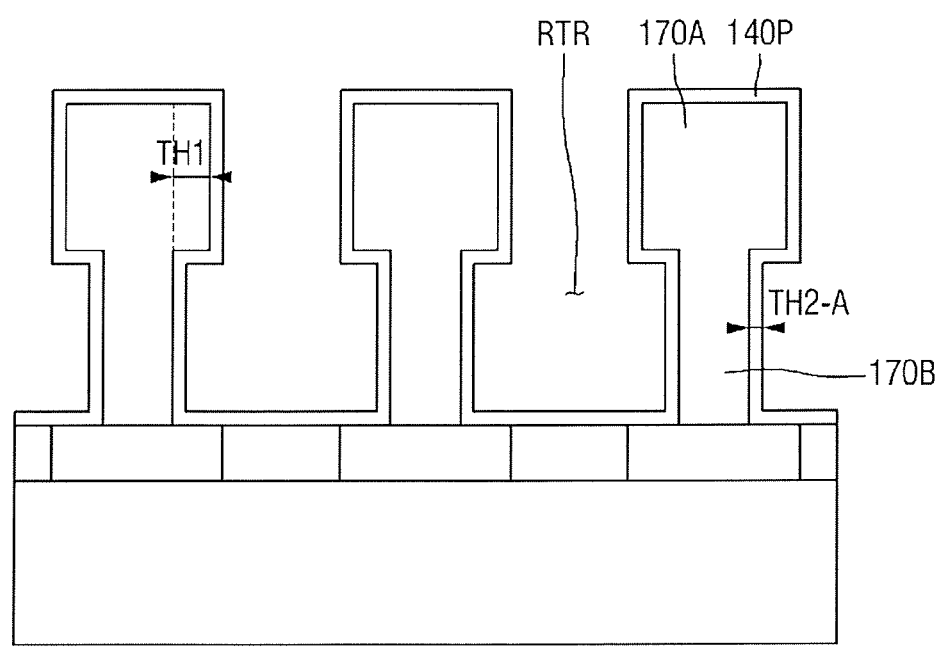

FIG. 9 shows a preliminary gate insulating layer formed after step 700 of FIG. 2 is performed according to an exemplary embodiment of the present inventive concept.

A preliminary gate insulating layer 140P is formed on the resulting structure of FIG. 8. For example, the preliminary gate insulating layer 140P is conformally formed within the recessed trench RTR to cover the T-shaped gate structure using an ALD process, a CVD process, a PECVD process or an MOCVD process.

The preliminary gate insulating layer 140P may have a predetermined thickness with which a region under the overhang part OHP of the upper part 170A is not filled. For example, the preliminary gate insulating layer 140P is formed on a sidewall of the lower part 170B under the overhang part OHP. The preliminary gate insulating layer 140P has a thickness TH2-A smaller than the overhang part thickness TH1.

The preliminary gate insulating layer 140P may be formed of a high-k dielectric material including HfO or $HfSiO_x$, where x is a rational number less than 1.

Figure 10:
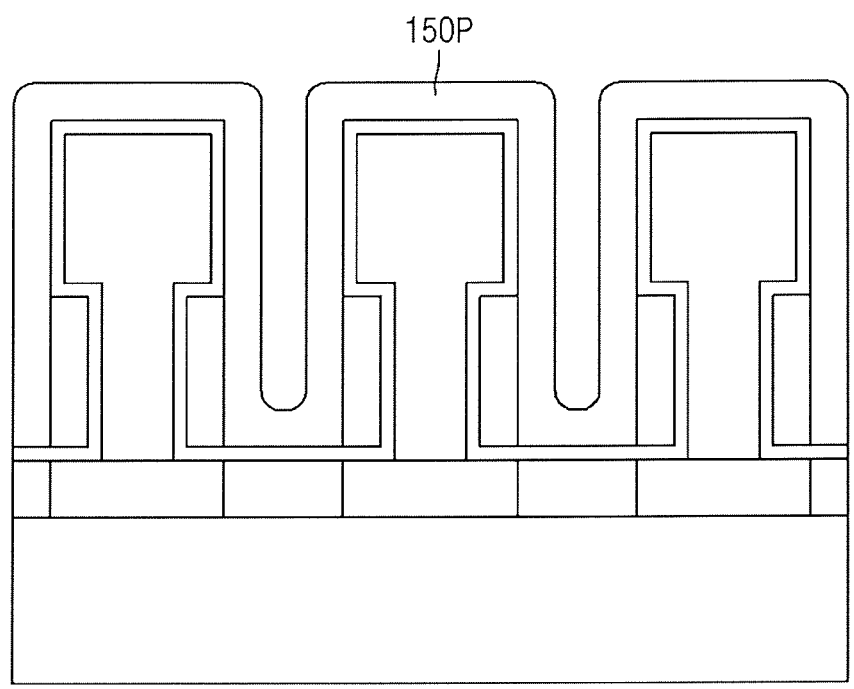

FIG. 10 shows a preliminary work-function-control layer formed after step 800 of FIG. 2 is performed according to an exemplary embodiment of the present inventive concept.

A preliminary work-function-control layer 150P is conformally formed within the recessed trench RTR without completely filling the recessed trench RTR. The present inventive concept is not limited thereto. For example, the preliminary work-function-control layer 150P may be formed so that the preliminary work-function-control layer 150P completely fills the recessed trench RTR or fill the recessed trench RTR having a void within the preliminary work-function-control layer 150P.

The preliminary work-function-control layer 150P may be formed using a CVD process. The preliminary work-function-control layer 150P may be formed of nitride including TiN.

Figure 11:
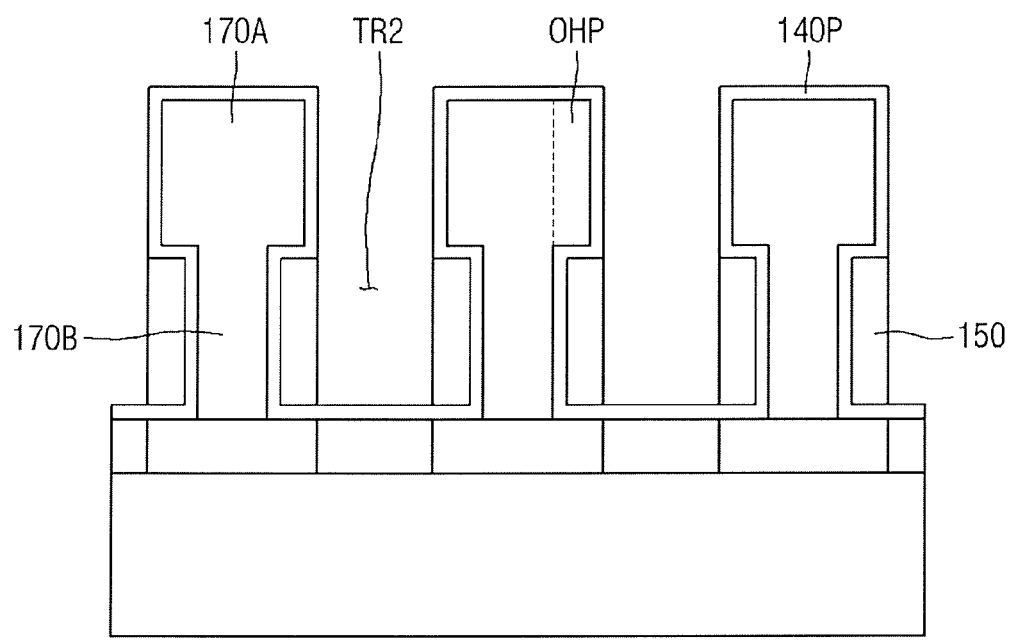

FIG. 11 shows a work-function-control pattern formed after step 900 of FIG. 2 is performed according to an exemplary embodiment of the present inventive concept.

The preliminary work-function-control layer 150P may be partially removed using a fourth etching process. The fourth etching process may be performed until the preliminary gate insulating layer 140P within the recessed trench RTR is exposed. The fourth etching process may be an anisotropic etching process including an RIE process. In the anisotropic etching process, the overhang part OHP may serve as an etch mask so that the preliminary work-function-control layer 150P under the overhang part OHP remains to form a work-function-control pattern 150 and a second trench TR2. In other words, the work-function-control pattern 150 is self-aligned under the overhang part OHP.

The second trench TR2 is formed within the recessed trench RTR and defined by the work-function-control patterns 150 within the recessed trench RTR. For example, the second trench TR2 is disposed between two adjacent work-function-control patterns 150 within the recessed trench RTR; and the second trench TR2 is also disposed between two adjacent upper parts 170A.

Figure 12:
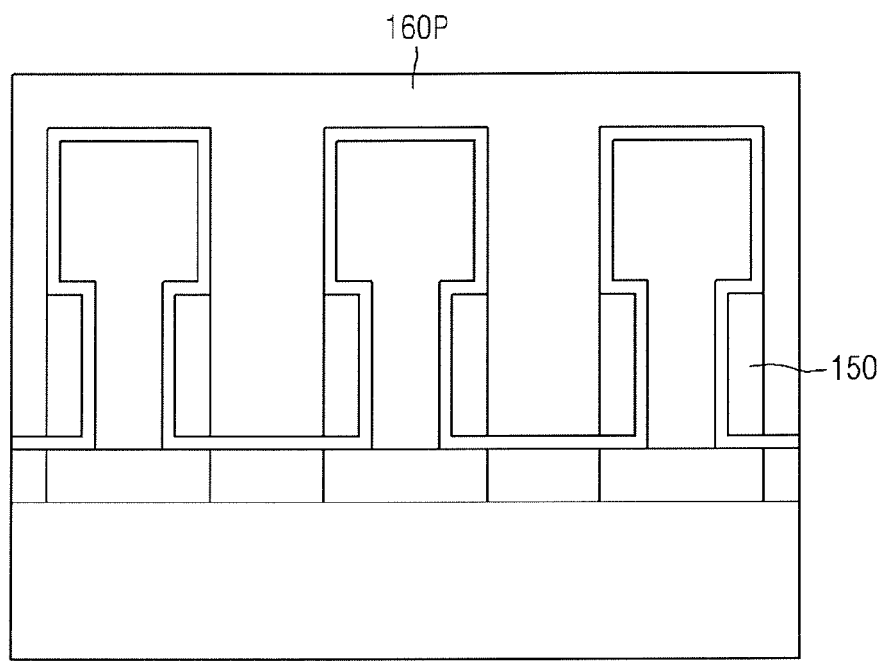

FIG. 12 shows a gate electrode layer formed after step 1000 of FIG. 2 is performed according to an exemplary embodiment of the present inventive concept.

A preliminary gate electrode layer 160P is formed within the second trench TR2, filling the second trench TR2. A CVD process may be applied to form the preliminary gate electrode layer 160P. The preliminary gate electrode layer 160P may be formed of a conductive material including tungsten (W) or copper (Cu).

Figure 13:
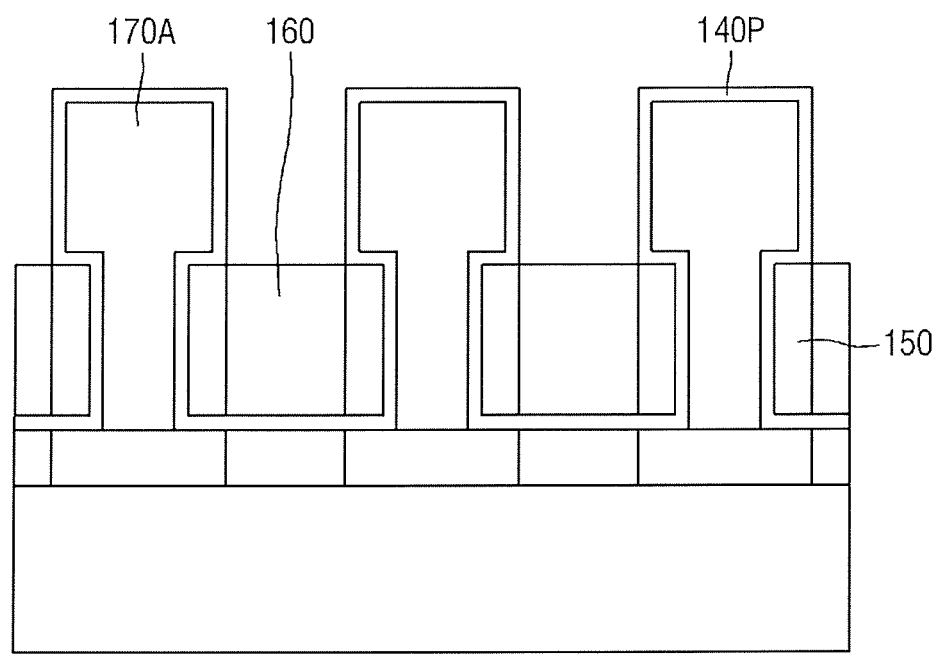

FIG. 13 shows a gate electrode formed after step 1100 of FIG. 2 is performed according to an exemplary embodiment of the present inventive concept.

The preliminary gate electrode layer 160P may be recessed using an etchback process to form a gate electrode 160. The gate electrode 160 has an upper surface coplanar with an upper surface of the work-function-control pattern 150. Depending on a process variation of the etchback process, an upper surface of the gate electrode 160 may be higher or lower than an upper surface of the work-function-control pattern 150.

In step 1100, the preliminary gate insulating layer 140P disposed on the upper part 170A is removed. The removal of the preliminary gate insulating layer 140P may be performed in a separate process of the recessing of the preliminary gate electrode layer 160P. The present inventive concept is not limited thereto. The removal of the preliminary gate insulating layer 140P and the recessing of the preliminary gate electrode layer 160P may be performed at substantially the same time.

Figure 14:
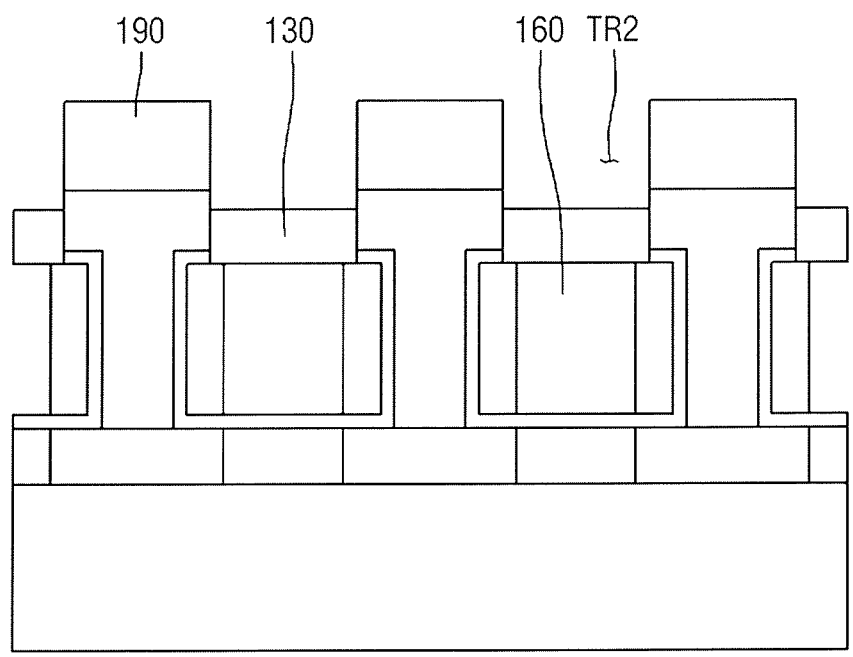

FIG. 14 shows an upper spacer formed after step 1200 of FIG. 2 is performed according to an exemplary embodiment of the present inventive concept. The upper spacer 130 is formed within the second trench TR2. For example, the upper spacer 130 is formed on an upper surface of the gate electrode 160. The formation of the upper spacer 130 is described in U.S. patent application Ser. No. 15/229,881, filed on Aug. 5, 2016, which is hereby incorporated by reference.

After the formation of the upper spacer 130, step 1250 of FIG. 2 is performed to form an upper S/D 190. P-type impurities including $B^+$ or N-type impurities including $As^+$ may be doped in the lower S/D using an ion implantation process or a diffusion process.

According to an exemplary embodiment of the present inventive concept, a gate length of a V-FinFET has a gate length which is determined by a T-shaped fin structure, because a gate oxide and a work-function control pattern are formed to be self-aligned under an overhang part of the T-shaped fin structure.

Figure 15:
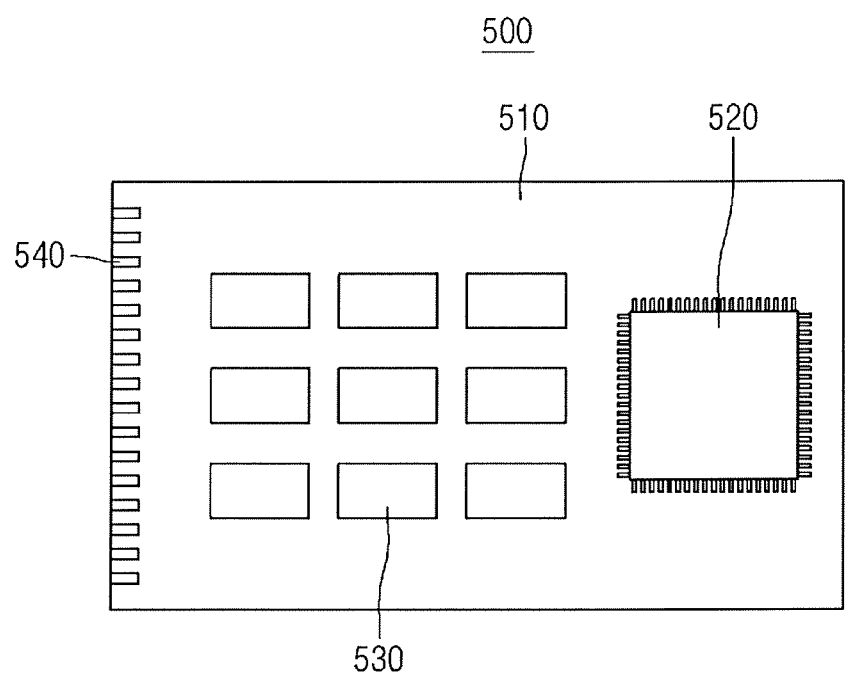
FIG. 15 is a semiconductor module having a V-FinFET fabricated according to an exemplary embodiment of the present inventive concept.

FIG. 15 is a semiconductor module having a semiconductor device fabricated according to an exemplary embodiment of the present inventive concept.

Referring to FIG. 15, the semiconductor module 500 includes a semiconductor device 530. The semiconductor device 530 may be formed according to an exemplary embodiment of the present inventive concept. The semiconductor device 530 is mounted on a semiconductor module substrate 510. The semiconductor module 500 further includes a microprocessor 520 mounted on the semiconductor module substrate 510. Input/output terminals 540 are disposed on at least one side of the semiconductor module substrate 510. The semiconductor module 500 may be included in a memory card or a solid state drive (SSD).

Figure 16:
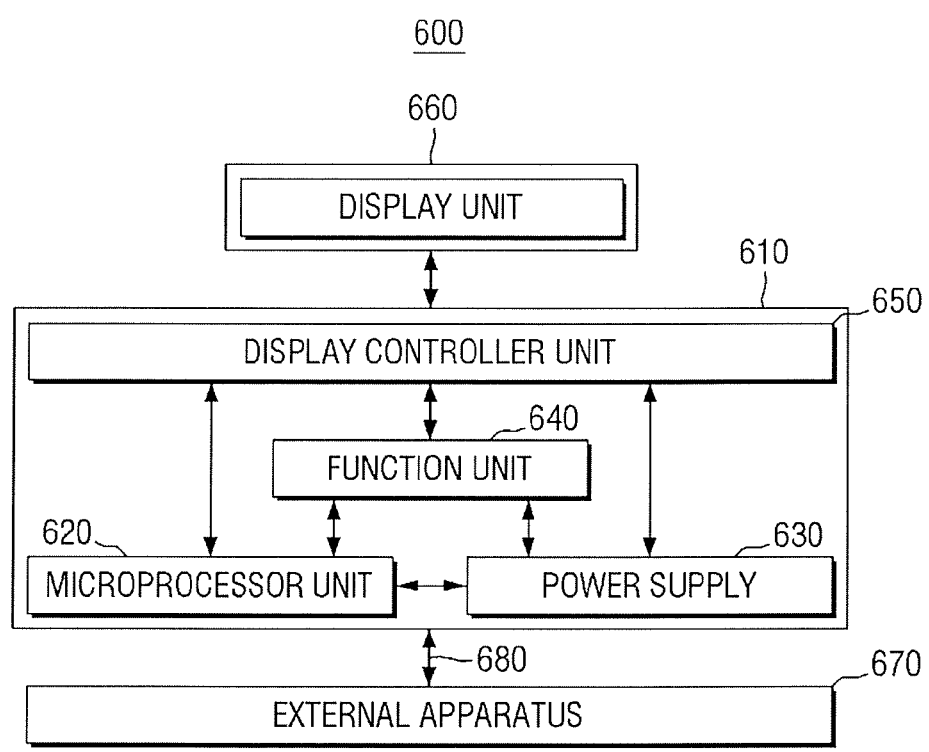
FIG. 16 is a block diagram of an electronic system having a V-FinFET according to an exemplary embodiment of the present inventive concept.

FIG. 16 is a block diagram of an electronic system having a semiconductor device according to an exemplary embodiment of the present inventive concept.

Referring to FIG. 16, a semiconductor device fabricated according to an exemplary embodiment of the present inventive concept may be included in an electronic system 600. The electronic system 600 includes a body 610, a microprocessor unit 620, a power supply 630, a function unit 640, and a display controller unit 650. The body 610 may include a system board or a motherboard having a printed circuit board (PCB) or the like. The microprocessor unit 620, the power supply 630, the function unit 640, and the display controller unit 650 are mounted or disposed on the body 610. A display unit 660 may be stacked on an upper surface of the body 610. For example, the display unit 660 is disposed on a surface of the body 610, displaying an image processed by the display controller unit 650. The power supply 630 receives a constant voltage from an external power supply, generating various voltage levels to supply the voltages to the microprocessor unit 620, the function unit 640, the display controller unit 650, etc. The microprocessor unit 620 receives a voltage from the power supply 630 to control the function unit 640 and the display unit 660. The function unit 640 may perform various functions of the electronic system 600. For example, when the electronic system 600 is a mobile electronic product such as a cellular phone, or the like, the function unit 640 may include various components to perform wireless communication functions such as dialing, video output to the display unit 660 or voice output to a speaker through communication with an external device 670, and when a camera is included, it may serve as an image processor. In an exemplary embodiment, if the electronic system 600 is connected to a memory card to expand the storage capacity, the function unit 640 may serve as a memory card controller. The function unit 640 may exchange signals with the external device 670 through a wired or wireless communication unit 680. Further, when the electronic system 600 requires a Universal Serial Bus (USB) to extend the functions, the function unit 640 may serve as an interface controller. The function unit 640 may include a semiconductor device fabricated according to an exemplary embodiment of the present inventive concept.

Figure 17:
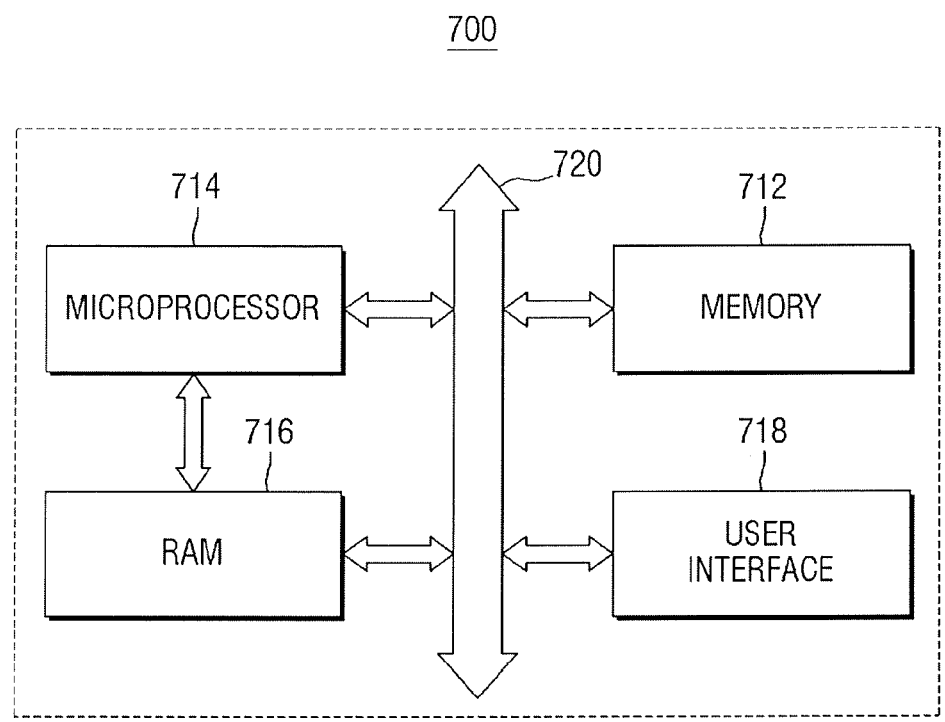
FIG. 17 is a block diagram of an electronic system having a V-FinFET fabricated according to an exemplary embodiment of the present inventive concept.

FIG. 17 is a block diagram of an electronic system having a semiconductor device fabricated according to an exemplary embodiment of the present inventive concept.

Referring to FIG. 17, the electronic system 700 may be included in a mobile device or a computer. For example, the electronic system 700 includes a memory system 712, a microprocessor 714, a random access memory (RAM) 716, and a user interface 718 configured to perform data communication using a bus 720. The microprocessor 714 may program and control the electronic system 700. The RAM 716 may be used as an operational memory of the microprocessor 714. For example, the microprocessor 714 or the RAM 716 may include a semiconductor device fabricated according an exemplary embodiment of the present inventive concept.

The microprocessor 714, the RAM 716, and/or other components may be assembled within a single package. The user interface 718 may be used to input or output data to or from the electronic system 700. The memory system 712 may store operational codes of the microprocessor 714, data processed by the microprocessor 714, or data received from the outside. The memory system 712 may include a controller and a memory.

While the present inventive concept has been shown and described with reference to exemplary embodiments thereof, it will be apparent to those of ordinary skill in the art that various changes in form and detail may be made therein without departing from the spirit and scope of the inventive concept as defined by the following claims.

What is claimed is:

1. A vertical fin field effect transistor (V-FinFET), comprising:
   a substrate;
   a T-shaped fin structure extending vertically from an upper surface of the substrate,
   wherein the T-shaped fin structure includes a lower part and an upper part,
   wherein the lower part is in contact with the upper surface of the substrate, and
   wherein the upper part of the T-shaped fin structure is vertically stacked on the lower part of the T-shaped fin structure;
   a gate insulating layer surrounding the lower part;
   a work-function-control pattern surrounding the lower part, wherein the gate insulating layer is interposed between the work-function-control pattern and the lower part of the T-shaped fin structure; and
   a gate electrode disposed on a sidewall of the work-function-control pattern.

2. The V-FinFET of claim 1,
   wherein the upper part of the T-shaped fin structure has a first width and the lower part of the T-shaped fin structure has a second width smaller than the first width.

3. The V-FinFET of claim 2,
wherein the difference between the first width and the second width is smaller than a combined thickness of the gate insulating layer and the work-function-control pattern.

4. The V-FinFET of claim 1,
wherein the upper part of the T-shaped fin structure includes an overhang part which is non-overlapped with the lower part, and
wherein the work-function-control pattern is disposed underneath the overhang part.

5. The V-FinFET of claim 4,
wherein a sidewall of the work-function-control pattern is in contact with the gate electrode and is positioned beyond a sidewall of the upper part of the T-shaped fin structure.

6. The V-FinFET of claim 4,
wherein a bottom surface of the overhang part is in contact with the gate insulating layer.

7. The V-FinFET of claim 6,
wherein the gate insulating layer is interposed between the overhang part and the work-function-control pattern.

8. The V-FinFET of claim 4,
wherein a thickness of the overhang part of the T-shaped fin structure is smaller than a combined thickness of the gate insulating layer and the work-function-control pattern.

9. The V-FinFET of claim 1,
wherein the work-function-control pattern and the gate electrode have substantially the same heights.

10. The V-FinFET of claim 1, further comprising:
a lower spacer disposed under the gate electrode; and
an upper spacer disposed on an upper surface of the gate electrode,
wherein the upper spacer, the gate electrode and the lower spacer are vertically stacked on each other.

11. The V-FinFET of claim 1, further comprising:
a lower source/drain disposed under the lower part of the T-shaped fin structure; and
an upper source/drain disposed in the upper part of the T-shaped fin structure.

12. A vertical fin field effect transistor (V-FinFET), comprising:
a substrate;
a first T-shaped fin structure and a second T-shaped fin structure extending vertically from an upper surface of the substrate,
wherein each of the first and second T-shaped fin structures includes a lower part and an upper part,
wherein each of the lower parts of the first and second T-shaped fin structures is in contact with the upper surface of the substrate, and
wherein each of the upper parts of the first and second T-shaped fin structures is stacked on each of the lower parts of the first and second T-shaped fin structures;
a recessed trench disposed between the first T-shaped fin structure and the second T-shaped fin structure;
a gate insulating layer disposed within the recessed trench;
first and second work-function-control patterns disposed within the recessed trench so that a sidewall of the first work-function-control pattern is positioned beyond a sidewall of the upper part of the first T-shaped fin structure and a sidewall of the second work-function-control pattern is positioned beyond a sidewall of the upper part of the second T-shaped fin structure; and
a gate electrode disposed between the first work-function-control pattern and the second work-function-control pattern.

13. The V-FinFET of claim 12, further comprising:
a lower spacer disposed under the gate electrode; and
an upper spacer disposed on an upper surface of the gate electrode,
wherein the upper spacer, the gate electrode and the lower spacer are vertically stacked on each other.

14. The V-FinFET of claim 12, further comprising:
a lower source/drain disposed under the lower part of the first T-shaped fin structure; and
an upper source/drain disposed within the upper part of the first T-shaped fin structure.

* * * * *